United States Patent [19]

Kim et al.

[11] Patent Number: 5,723,258
[45] Date of Patent: Mar. 3, 1998

[54] ACETAL GROUP-CONTAINING ALKOXY-STYRENE POLYMERS, METHOD OF PREPARING THE SAME AND CHEMICAL AMPLIFIED PHOTORESIST COMPOSITION MAINLY COMPRISING THE SAME

[75] Inventors: Ji-Hong Kim; Sun-Yi Park; Seong-Ju Kim; Joo-Hyeon Park, all of Taejeon, Rep. of Korea

[73] Assignee: Korea Kumho Petrochemical Co., Ltd., Seoul, Rep. of Korea

[21] Appl. No.: 804,288

[22] Filed: Mar. 3, 1997

Related U.S. Application Data

[62] Division of Ser. No. 744,738, Oct. 30, 1996.

[30] Foreign Application Priority Data

Nov. 28, 1995 [KR] Rep. of Korea ............ 95-44207

[51] Int. Cl.$^6$ ............................................. G03C 1/492
[52] U.S. Cl. ........................ 430/270.1; 430/326; 430/909
[58] Field of Search ............................... 430/270.1, 326, 430/909

*Primary Examiner*—Joseph L. Schofer
*Assistant Examiner*—N. Sarofim
*Attorney, Agent, or Firm*—Harrison & Egbert

[57] ABSTRACT

There are provided acetal group-containing alkoxy-styrene polymers represented by the following formula I:

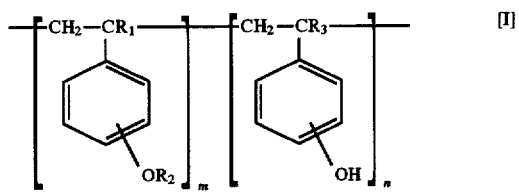

wherein $R_1$ and $R_3$ may be the same or different, and represent a hydrogen atom or a methylene group; $R_2$ represents

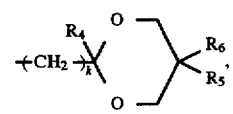

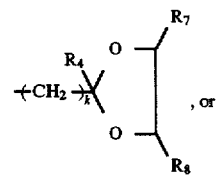

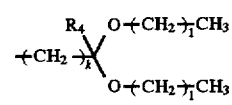

wherein $R_4$, $R_5$, $R_6$, $R_7$ and $R_8$ may be the same or different, and independently represent a hydrogen atom, an alkyl group or an aryl group; m+n=1; k is an integer of 1–5; and l is an integer of 0–5; and an acid-generating agent, and chemical amplified negative photoresist composition comprising the same. It shows excellent transparency and sensitivity to deep UV in addition to being resistant to dry etching and alkali-developable.

1 Claim, No Drawings

ACETAL GROUP-CONTAINING ALKOXY-STYRENE POLYMERS, METHOD OF PREPARING THE SAME AND CHEMICAL AMPLIFIED PHOTORESIST COMPOSITION MAINLY COMPRISING THE SAME

This is a divisional of co-pending application Ser. No. 08/744,738 filed on Oct. 30, 1996.

BACKGROUND OF THE INVENTION

1. Field of the Invention

The present invention relates to a photoresist resin useful for forming fine patterns in very large scale integrated circuit (hereinafter referred to as "VLSI"). More particularly, the present invention relates to an acetal group-containing alkoxy-styrene polymer useful for chemical amplified photoresist of high sensitivity and resolution. Also, the present invention is concerned with a method for preparing the polymer and a chemical amplified photoresist composition mainly comprising the same.

2. Description of the Prior Art

Recently, there has been a need for fineness of pattern rule due to high integration and high speediness of large scale integrated (LSI) circuit. However, there is a limitation for forming fine patterns, because light has long wavelength, which irradiated from light sources as used in usual exposure techniques.

For this reason, more recently, new light sources, for example, g line (wavelength 436 nm) or i line (wavelength 365 nm) irradiated from ultra-high pressure mercury lamp have been developed. In this case, however, the pattern rule is, limited to a resolution of about 0.5 µm. Thus, LSI having an integration degree of at most 16 MDRAM could be prepared.

Still more recently, intensive research has been made to overcome such limit as to the integration degree. As a result, deep-UV having shorter wavelength than that of g line or i line was found to be useful as a light source and deep-UV lithography using the light source was promising. The deep-UV lithography makes it possible to form pattern rule with a resolution of 0.1 to 0.3 µm. Meanwhile, LSI can be produced in a large scale by a lithographic technique using KrF excimer laser as a light source. Thus, resist materials corresponding this technique are required properties of low photo-absorption and high sensitivity as conditions for resist materials.

Meanwhile, chemical amplified resists were developed as resist materials having high resolution and high resistance to dry etching as well as having sensitivity equivalent or higher than that of conventional high sensitivity resist materials. For example, a three-component chemical amplified negative resist material consisting of a novolak resin, a melamine compound and a photo acid-generating agent was already commercially produced by Sipley, sold under the tradename of "SAL601 ER7". Another example of chemical enhanced resist material, developed by CIBA Geigy, comprises an acetal protected by aromatic ring aldehyde, an onium salt and a phenolic resin, as disclosed in SPIE vol. 1925, p. 109. The protected acetal serves as a crosslinking group for the phenolic resin. It is reported that this resist material is not only highly transparent and sensitive to deep UV, but can be subjected to alkali development.

SUMMARY OF THE INVENTION

The present inventors made research to develop photo sensitive resins for forming fine patterns in preparing VLSI. As a result, the inventors found that acetal group-containing alkoxy-styrene polymers may exhibit useful photolithographical activity in the presence of Broenstead acid such as an onium salt. Thus, the present invention has been completed, based on this finding.

It is an object of the present invention to provide an acetal group-containing alkoxy-styrene polymer, represented by the following formula I, useful as a material for chemical amplified photoresist of high resolution and sensitivity.

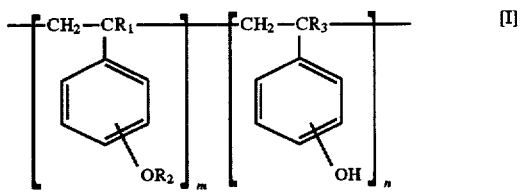

wherein $R_1$ and $R_3$ may be the same or different, and represent a hydrogen atom or a methylene group; $R_2$ represents

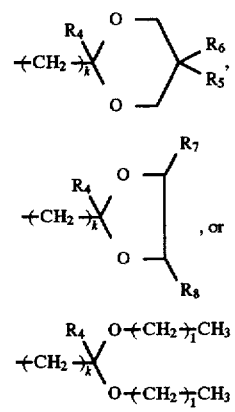

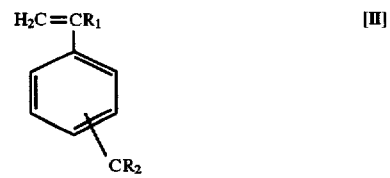

wherein $R_4$, $R_5$, $R_6$, $R_7$ and $R_8$ independently represent a hydrogen atom, an alkyl group or an aryl group; m+n=1; k is an integer of 1–5; and l is an integer of 0–5.

It is another object of the present invention to provide a method for preparing the polymer.

It is a further object of the present invention to provide a chemical amplified photoresist composition comprising the polymer.

DETAILED DESCRIPTION OF THE INVENTION

The polymers represented by formula I according to the present invention may be prepared by the following two methods:

A) Acetal group-containing alkoxy-styrene polymers of formula I may be prepared by radical polymerization of acetal group-containing alkoxy-styrenes represented by general formula II:

$$H_2C=CR_1$$ [II]

(benzene ring with $CR_2$)

wherein $R_1$ represents a hydrogen atom or a methyl group;

$R_2$ represents

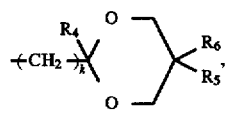

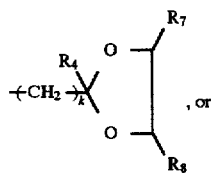, or

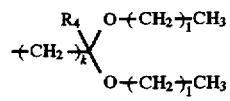

wherein $R_4$, $R_5$, $R_6$, $R_7$ and $R_8$ may be the same or different, and independently represent a hydrogen atom, an alkyl group or an aryl group; $m+n=1$;

k is an integer of 1–5; and l is an integer of 0–5.

In case of preparing the polymer of formula I by polymerizing monomer of formula II, th polymer having structure unit of $n=0$ is obtained.

Polymerization initiators which may be used in the present invention include radical initiators generally known. Representative example can be mentioned azo compounds such as azobisisobutyronitrile, and peroxides such as tert-butylhydroperoxide and di-tert-butylperoxide.

The polymerization reaction of the present invention may be carried out in bulk or solution polymerization method. Solvents used in the solution, polymerization method are not particularly limited, but o-dichlorobenzene, chlorobenzene, dichloromethane, toluene, benzene etc. are preferred.

Polymerization temperature may be selected to control molecular weight, reaction rate, etc., but the range of 30° to 80° C. is preferred.

Molecular weight and molecular weight distribution of polymer according to the present invention are influenced by polymerization temperature, kind and amount of the used polymerization solvent. By suitably controlling these, the polymer having a weight average molecular weight of 500 to 10,000,000.

The polymerization by anionic polymerization initiators is effective in case of preparing polymers with narrow molecular weight distribution or being not satisfied the preparation of polymers by radical polymerization initiators.

B) Acetal group-containing alkoxy-styrene polymers of formula I may be prepared by substituting an active hydrogen of the hydroxyl group in a polyvinylphenol represented by general formula III:

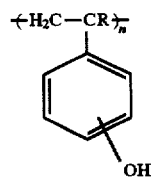

wherein R represents a hydrogen atom or a methyl group, with an acetal group-containing halide represented by formula IV, V or VI:

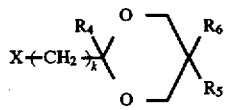 [IV]

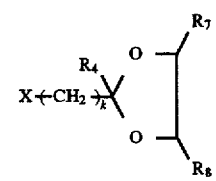 [V]

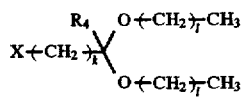 [VI]

wherein X is Cl or Br; and $R_4$, $R_5$, $R_6$, $R_7$, $R_8$, k and l are as hereinbefore defined.

Organic solvents used in the present invention are not particularly limited, and preferably include polar solvents such as acetonitrile, dioxane, dimethyl sulfoxide, dimethylformamide, tetrahydrofuran, etc.

Any basic catalysts can be used as catalysts being used in substitution reaction. Preferred basic catalysts include potassium carbonate, sodiumcarbonate, potassium hydroxide and sodium hydroxide.

As in the polymerization, the substitution reaction rate of compounds of formulas IV, V, and VI to the polyvinylphenol represented by the general formula II can be adjusted by controlling the reaction mole ratio, reaction time, reaction temperature, etc.

The polymer of the present invention is acetal group-containing alkoxy-styrene polymer. A chemical amplified photoresist composition consisting mainly of the acetal group-containing alkoxy-styrene polymer and an agent which generates acid by irradiation light is highly sensitive to radiation, especially, deep UV, and forms negative patterns of high resolution. Thus, it is suitable for the preparation of semiconductor device.

When the polymer of the invention is used as a photoresist material,

A) its molecular weight serves as an imaportant factor affecting the performance of the photoresist, and is preferably on the order of approximately 5,000 to 500,000 in weight average molecular weight; and B) the substitution ratio, that is, contents of m and n in Formula I, e.g. ranging from 0 to 0.99, can be available. The ratio may be properly selected according to the photoresist's purpose. In particular, upon developing with alkaline solution, the polymers with $n=0.1$ are preferred.

For photo acid-generating agent, any material that is capable of generating acid when being irradiated, may be used. Preferred are onium cationic photoinitiators. Such acid-generating agent or onium cationic photoinitiator is preferably used in an amount of about 0.1 to 20% by weight of the polymer and more preferably about 0.5 to 5% by weight. The sensitivity of the resist increases as the amount of the acid-generating agent increases. However, the performance of the resist is irrespective of its amount.

The photosensitive resin composition of the invention is prepared by dissolving the alkoxy-styrene polymer and the acid-generating agent in manyfold volumes of an organic solvent. The organic solvents are not paricularly limited, but are required to dissolve the components enough and enable for the resist film to be uniformly coated. For example, butyl acetate, dioxane, xylene, cyclohexanone, acetone, methylcellosolve acetate, ethyleneglycolmonomethylether, amyl acetate, diethyleneglycolmonomethylether, ethyleneglycolmonoethylether, methylisobutyl ketone, diethylene glycol dibutylether, diethyl glycol, methyl lactate, ethyl lactate, propyl lactate, and butyl lactate may be used alone or in combination of these.

A better understanding of the present invention may be obtained in light of following examples which are set forth to illustrate, but are not to be construed to limit, the present invention.

SYNTHESIS EXAMPLES OF COMPOUND OF FORMULA II

Synthesis Example I

In a 500 ml flask, 120 ml of acetonitrile, 13.8 g of 4-hydroxybenzaldehyde, 21.1 g of 2-(2-bromoethyl)-1,3-dioxane, 1.8 g of potassium iodide, and 35.8 g of potassium carbonate were placed and then, reacted at 80° C. for 5 hrs. Thereafter, 200 ml of ethyl acetate was added to the reaction mixture and washed once with a saturated aqueous potassium carbonate solution, distilled water, and saturated saline. The washed organic phase was dried over anhydrous magnesium sulfate and removed solvent, to give 25.6 g of 4-(2-[1,3]-dioxane-2-yl-ethoxy)benzaldehyde.

In another 2 liter flask, 57.2 g of methyl triphenylphosphonium bromide was placed. 500 ml of anhydrous ether was poured and then, stirred. To the resulting solution was slowly added 18.0 g of potassium tert-butoxide and reacted at room temperature for 3 hrs. 25.6 g of the above 4-(2-[1,3]-dioxane-2-yl-ethoxy)benzaldehyde was dissolved in 200 ml of anhydrous ether and was slowly added to the reaction mixture and then subjected to reaction at room temperature for 4 hrs. After completion of the reaction, the produced solid by-product was filtered off and washed with distilled water and saturated saline. The organic phase washed was dried over anhydrous magnesium sulfate and the solvent was removed by distillation under reduced pressure. The reaction mixture was purified by Silica gel column chromatography to obtain 19.7 g of 2-[2-(4-vinylphenoxy)ethyl]-[1,3]-dioxane, represented by the following formula:

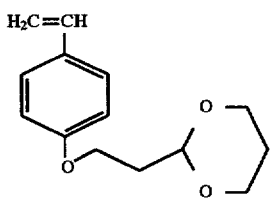

Synthesis Example II

In a 500 ml flask, 120 ml of acetonitrile, 13.8 g of 4-hydroxybenzaldehyde, 19.9 g of 2-(2-bromoethyl)-1,3-dioxane, 1.8 g of potassium iodide, and 35.8 g of potassium carbonate were placed and then, reacted at 80° C. for 5 hr. Thereafter, to the reaction mixture was added 200 ml of ethyl acetate and washed once with a saturated aqueous potassium carbonate solution, distilled water and saturated saline. The washed organic phase was dried over anhydrous magnesium sulfate and the solvent was removed, to give 23.7 g of 4-(2-[1,3]-dioxolan-2-yl-ethoxy)benzaldehyde.

In another 2 liter flask, 57.2 g of methyl triphenylphosphonium bromide was placed. 500 ml of anhydrous ether was poured and then, stirred. To the resulting solution was slowly added 18.0 g of potassium tert-butoxide and reacted at room temperature for 3 hrs. 23.7 g of the above 4-(2-[1,3]-dioxolan-2-yl-ethoxy)benzaldehyde was dissolved in 200 ml of anhydrous ether and was slowly added to the reaction mixture and then subjected to reaction at room temperature for 4 hrs. After completion of the reaction, the produced solid by-product was filtered off and washed with distilled water and saturated saline. The organic phase washed was dried over anhydrous magnesium sulfate and the solvent was removed by distillation under reduced pressure. The reaction mixture was purified by Silica gel column chromatography to obtain 20.8 g of 2-[2-(4-vinylphenoxy)ethyl]-[1,3]-dioxolan, represented by the following formula:

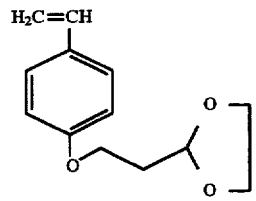

POLYMERIZATION OF THE COMPOUND OF FORMULA I

Example I

In a 200 ml flask, 50 ml of dimethyl sulfoxide, 3.4 g of poly(4-hydroxystyrene) having a polystyrene-calculated average molecular weight of 9,400, 3.9 g of potassium carbonate, 0.9 g of potassium iodide and 8.2 g of 2-(2-bromoethyl)1,3-dioxane were poured and heated to 80° C. to stir at 80° C. for 5 hrs. After completing the reaction, the solution was dropwise added in a beaker including 500 ml of distilled water, to produce white precipitates. The precipitates were filtered off and dried in vacuuo for 24 hrs, to obtain 4.2 g of polymer. The polymer was analysed by nuclear magnetic resonance ($^1$H-NMR) to identify a compound having the following formula A.

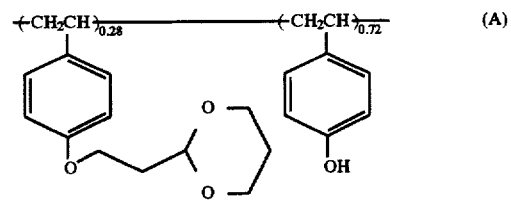

Example II

In a 50 ml glass flask, 5 g of 2-[2-(4-vinylphenoxy)ethyl] -[1,3]-dioxane obtained in Preparation Example I, 25 ml of o-dichlorobenzene and 0.04 g of azobisisobutylonitrile were charged. The flask was purged with nitrogen gas to remove oxygen therein. This mixture was subjected to polymerization at 80° C. for 15 hrs. After completing polymerization, the reaction was introduced to large quantity of methyl alcohol, to precipitate white polymer. The polymer was well washed with methyl alcohol and dried in vacuuo at room temperature for 24 hrs, to obtain 3.5 g of polymer. The polmer was analysed by Gel permeation chromatography (GPC) to identify a compound having the following structural formula B:

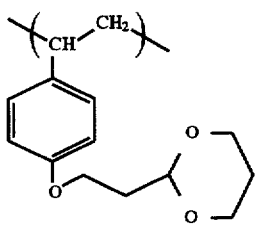
(B)

Also, the polymer was found to have a weight average molecular weight (Mw) of 85,000 when calculated in terms of polystyrene and to have a molecular weight distribution (Mw/Mn) of 1.7 wherein Mn is a number average molecular weight.

Example III

Together with 1.5 parts by weight of triphenylphosphonium triflate, 50 parts by weight of the polymer of Formula A obtained in Example I was dissolved in propylene glycol monomethylether. The resulting solution was filtered through a teflon filter with a pore size of 0.1 μm to prepare a resist solution. The resist solution was applied on a silicon wafer cleaned by usual method, to form a coating layer 0.8 μm thick. This silicon wafer was heat treated at 90° C. for 120 sec, the silicon wafer was exposed through a pattern chrome mask to a uv beam with a wavelength of 248 nm in a KrF excimer laser steper, such as that sold by Nikkon Co. Ltd., identified as "SNR-1755 (EX8A, NA=0.45)", followed by heating at 100° C. for 10 sec. Then, the wafer was developed in acetone for 10 sec to form a negative pattern. At an exposure energy of 20 mJ/cm$^2$, a good positive pattern 0.45 μm wide was observed through an electronic microscope, while scum was not observed in the unexposed areas.

Example IV

A negative pattern was formed in a similar manner to procedure of Example III, except that a resist solution was prepared by dissolving 50 parts by weight of the polymer of Formula B obtained in Example II and 1.0 part by weight of triphenylphosphonium trillate in propylene glycol monomethyl ether. Observation through an electronic microscope showed that a good negative pattern 0.40 μm wide was formed at an exposure energy of 30 mJ/cm$^2$.

Example V

A negative pattern was formed in a similar manner to procedure of Example III, except that a resist solution was prepared by dissolving 50 parts by weight of the polymer of Formula A obtained in Example I and 0.5 part by weight of triphenylphosphonium triflate in propylene glycol monomethyl ether and the wafer exposed was heated at 105° C. for 20 sec. Observation through an electronic microscope showed that an exposure energy of 30 mJ/cm$^2$ allowed a good negative pattern 0.40 μm wide.

Example VI

A negative pattern was prepared in a similar manner to that of Example III, except that a resist solution was prepared by dissolving 50 parts by weight of the polymer of Formula B obtained in Example II and 0.5 part by weight of triphenylphosphonium triflate in propylene glycol monomethyl ether and the wafer exposed was heated at 105° C. for 25 sec. Observation through an electronic microscope showed that an exposure energy of 35 mJ/cm$^2$ allowed a good negative pattern 0.38 μm wide.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A chemical enhanced photoresist composition, comprising:

at least one of acetal group-containing alkoxy-styrene polymers having a weight average molecular weight of 500–10,000,000, represented by the following formula I:

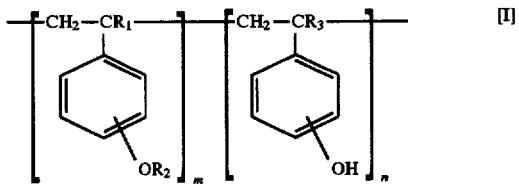

wherein $R_1$ and $R_3$ may the same or different, and represent a hydrogen atom or a methylene group;

$R_2$ represents

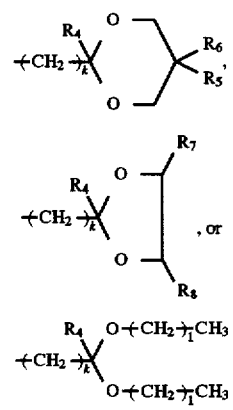

wherein $R_4$, $R_5$, $R_6$, $R_7$ and $R_8$ may be the same or different, and independently represent a hydrogen atom, an alkyl group or an aryl group; m+n=1; k is an integer of 1–5; and l is an integer of 0–5; and an acid-generating agent.

* * * * *